United States Patent
Gonzalez et al.

(10) Patent No.: US 6,277,731 B1
(45) Date of Patent: Aug. 21, 2001

(54) METHOD FOR FORMING A SEMICONDUCTOR CONNECTION WITH A TOP SURFACE HAVING AN ENLARGED RECESS

(75) Inventors: Fernando Gonzalez; Guy Blalock; Kirk Prall, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/584,256

(22) Filed: May 31, 2000

Related U.S. Application Data

(62) Division of application No. 09/310,649, filed on May 12, 1999, which is a continuation of application No. 08/595,834, filed on Feb. 2, 1996, now Pat. No. 5,994,220.

(51) Int. Cl.[7] .................................................. H01L 21/4763
(52) U.S. Cl. ......................... 438/629; 438/656; 438/672; 438/673; 438/701; 438/703; 438/713
(58) Field of Search ................................... 438/672, 673, 438/713, 629, 701, 656, 703

(56) References Cited

U.S. PATENT DOCUMENTS

| | | |
|---|---|---|
| 4,489,481 | 12/1984 | Jones . |
| 4,507,853 | 4/1985 | McDavid . |
| 5,091,768 | 2/1992 | Yamazaki . |
| 5,202,579 | 4/1993 | Fujii et al. . |
| 5,203,957 | 4/1993 | Yoo et al. . |
| 5,244,534 | 9/1993 | Yu et al. . |
| 5,254,498 | 10/1993 | Sumi . |
| 5,269,880 | 12/1993 | Jolly et al. . |
| 5,279,990 | 1/1994 | Sun et al. . |
| 5,332,691 | 7/1994 | Kinoshita et al. . |
| 5,358,901 | 10/1994 | Fiordalice et al. . |
| 5,364,817 | 11/1994 | Lur et al. . |
| 5,381,040 | 1/1995 | Sun et al. . |
| 5,397,742 | 3/1995 | Kim . |
| 5,427,980 | 6/1995 | Kim . |
| 5,453,403 | 9/1995 | Meng et al. . |
| 5,550,405 | 8/1996 | Cheung et al. . |
| 5,567,650 | 10/1996 | Straight et al. . |
| 5,658,829 | 8/1997 | Mathews et al. . |
| 5,892,285 | 4/1999 | Gonzalez et al. . |
| 5,994,220 | 12/1999 | Gonzalez et al. . |
| 6,043,151 | 3/2000 | Gonzalez et al. . |
| 6,066,559 | 5/2000 | Gonzalez et al. . |

Primary Examiner—John F. Niebling
Assistant Examiner—Lynne A. Gurley
(74) Attorney, Agent, or Firm—Kirkpatrick & Lockhart LLP

(57) ABSTRACT

A method of forming a connection is comprised of the steps of depositing a lower conductor. A dielectric layer is deposited on the lower conductor, with the dielectric layer having a lower surface adjacent to the lower conductor, and having an upper surface. An opening extending between the upper surface and the lower surface of the dielectric layer is formed. A conductive plug is deposited within the opening, with the plug having an upper surface proximate the upper surface of the dielectric layer. The upper surface has an edge where the upper surface of the plug is adjacent to the dielectric layer. A recess is formed proximate to the edge of the upper surface of the plug, the recess extending into both the plug and the dielectric layer. Finally, an upper conductor is deposited on the upper surface of the dielectric layer and the upper surface of the plug. A connection thus formed is also disclosed.

12 Claims, 5 Drawing Sheets

METHOD FOR FORMING A SEMICONDUCTOR CONNECTION WITH A TOP SURFACE HAVING AN ENLARGED RECESS

CROSS-REFERENCE TO RELATED APPLICATIONS

This is a divisional of U.S. patent application Ser. No. 09/310,649, filed May 12, 1999, which is a continuation of U.S. patent application Ser. No. 08/595,834, filed Feb. 2, 1996, now U.S. Pat. No. 5,994,220.

BACKGROUND OF THE INVENTION

1. Field of the Invention

The present invention is directed generally to semiconductor interconnections and a method for forming a semiconductor interconnect, such as a via or a contact, having an enlarged recess on its top surface.

2. Description of the Background

It is well known in the semiconductor art to use interconnects, known as vias and contacts, to connect an upper conductor of current, such as metal or-polysilicon, through a dielectric layer to a lower conductor of current. A via is an electrical connection between two metal layers, and a contact, in contrast, is an electrical connection between anything other than two metal layers, such as between metal and silicon. Vias and contacts are used extensively in very large scale integrated circuits, with an average circuit containing 16 million vias and contacts.

Vias and contacts are formed by an opening in a dielectric layer and a conductor within the opening. Directional deposition methods, such as evaporation and sputtering, are often used to deposit the conductor within the opening. Such methods, however, often provide poor step coverage and only a thin conductive layer on the vertical wall of the opening. Thin layers are often not sufficient to provide good electrical contact between the upper and lower conductors, and result in a high resistance and a propensity for electromigration failures.

The problem of poor step coverage is exaggerated as the size of opening shrinks, and the aspect ratio increases. As the diameter of an opening approaches one micron, the aspect ratio typically approaches 1 to 1. To reliably obtain good electrical connection, the opening is usually partially or entirely filled with a conductor, known as a "plug".

Prior art methods for forming a plug typically include tapering the top edge of the opening, followed by the formation of the plug in the opening, and concluding with a hydrofluoric acid bath. The tapering of the top edge is often accomplished with a sputter etch, and the purpose was to increase the surface area of the plug formed within the opening. The acid bath is used to clean the top surface of the dielectric layer, but it also dissolves some of the material at the interface between the plug and the dielectric layer, creating a small recess several hundred Angstroms deep around the top edge of the plug.

The prior art methods have several shortcomings, such as poor metal coverage over the interconnect due to the small recess, which often contains impurities that increase the contact resistance, and which may develop into a latent defect. The latent defect may take the form of erosion of a top level conductor deposited on the recess, and can be triggered if contaminants in the recess are exposed to moisture in a subsequent processing step. In addition, residuals left on the surface of the wafer after the plug is formed may cause shorts between conductors on the wafer surface. Those residuals are often not removed by the hydrofluoric acid bath used in the prior art. Furthermore, when a sputter etch is used to taper the corners of the opening, particles sputtered from the top edge of the opening end up in the bottom of the opening. These are particles of the dielectric layer, so they are not good conductors of current, and they increase the contact resistance at the bottom of the opening Additionally, silicon regions are often the lower conductor of an interconnect, and it is well known that sputtering damages and causes leakage in silicon. As a result, the prior art methods either risk damaging the silicon regions, or require several additional process steps to provide a protective coating on silicon prior to the sputtering, and to remove the protective coating after the sputtering.

Defects occur in about 1 in every 100 million contacts. Since the average semiconductor device contains about 16 million contacts, a defect maybe expected in more than one in every seven devices. The defects may be a latent defect caused by contamination in the recess, poor contact or adhesion at the top of the connection, poor contact at the bottom of the connection caused, for example, by dielectric material present from the sputtering step, or damage to a silicon region at the bottom of the opening.

Thus, the need exists for an improved method of forming a connection having reduced contact resistance, improved contact adhesion, and decreased susceptibility to latent defects.

SUMMARY OF THE INVENTION

The present invention is directed generally to a method of forming a connection in an integrated circuit. The method includes the step of depositing a lower conductor.

A dielectric layer is deposited on the lower conductor, with the dielectric layer having a lower surface adjacent to the lower conductor, and having an upper surface opposite the lower conductor. An opening extending between the upper surface and the lower surface of the dielectric layer is formed. A conductive plug is deposited within the opening. The plug has an upper surface proximate the upper surface of the dielectric layer. An edge of the upper surface is adjacent to the dielectric layer. A recess is formed proximate the edge of the upper surface. The recess extends into both the plug and the dielectric layer. Finally, an upper conductor is deposited on the upper surface of the dielectric layer and the upper surface of the plug.

The connection formed by the method of the invention is located within. a dielectric layer of an integrated circuit, and is located between an upper conductor and a lower conductor. A conductive plug is located within the opening, with the plug having an upper surface proximate the upper conductor, and an upper edge where the upper surface is adjacent to the dielectric layer; A recess is located proximate the upper edge of the plug. The recess extends into both the plug and the dielectric layer.

The invention solves the above-mentioned shortcomings in the prior art by cleaning the recess of impurities, thereby reducing the risk of a latent defect. Furthermore, at the same time that the recess is formed, the edge of the upper surface may be tapered thereby increasing the surface area of the plug, increasing the adhesion by an upper conductor and decreasing the contact resistance. Finally, the invention eliminates the need for sputtering the dielectric layer prior to the formation of the plug, thereby eliminating a source of dielectric material in the bottom of the opening, and eliminating a potential source of damage to the lower conductor.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

It is to be understood that the figures have been simplified to illustrate only those aspects of an interconnect which are relevant, and some of the dimensions have been exaggerated to convey a clear understanding of the present invention, while eliminating, for the purpose of clarity, some elements normally found in an interconnect. Those of ordinary skill in the art will recognize that other elements are required to produce an interconnect. However, because such elements and process steps are well known in the art, and because they do not further aid in the understanding of the present invention, a discussion of such elements is not provided herein.

Figure 1:
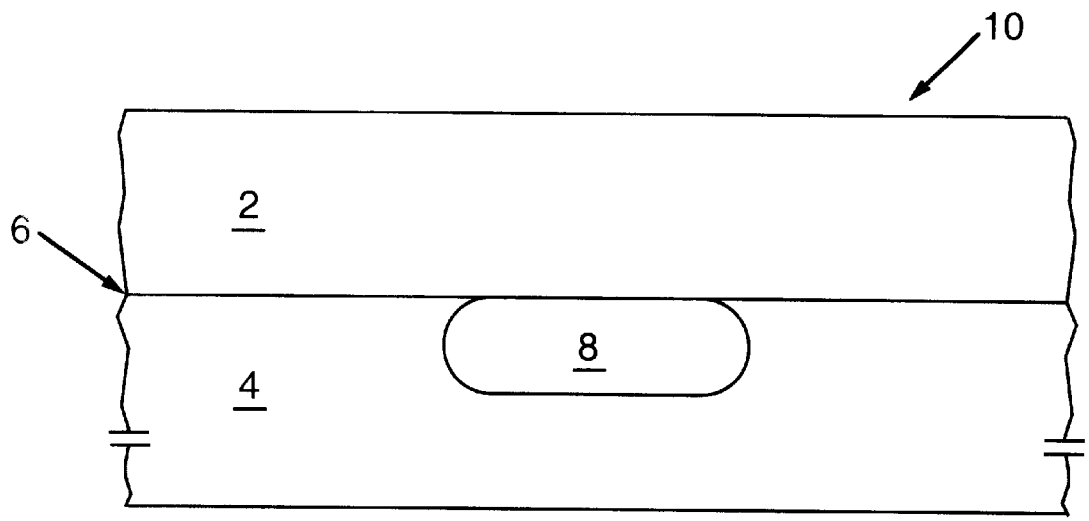
FIGS. 1–3 and 5–8 are cross sectional views of an integrated circuit at successive steps in a method of fabricating an interconnect according to an embodiment of the invention.

FIG. 1 is a cross-sectional view of a dielectric layer 2, a semiconductor layer 4, and an interface 6 between the dielectric layer 2 and the semiconductor layer 4. The dielectric layer 2 may be of any dielectric material, and in the described embodiment it is boro-phospho-silicate glass oxide ("BPSG oxide"). A lower conductor 8 is located in the semiconductor layer 2 adjacent to the interface 6, and may be any conductor of current, such as a doped semiconductor or a metal. In the described embodiment, the lower conductor 8 is an n+ doped semiconductor. The lower conductor 8 is patterned to form conductive paths as is known in the art. The dielectric layer 2, semiconductor layer 4, interface 6, and lower conductor 8 form a portion of an integrated circuit 10.

Figure 2:
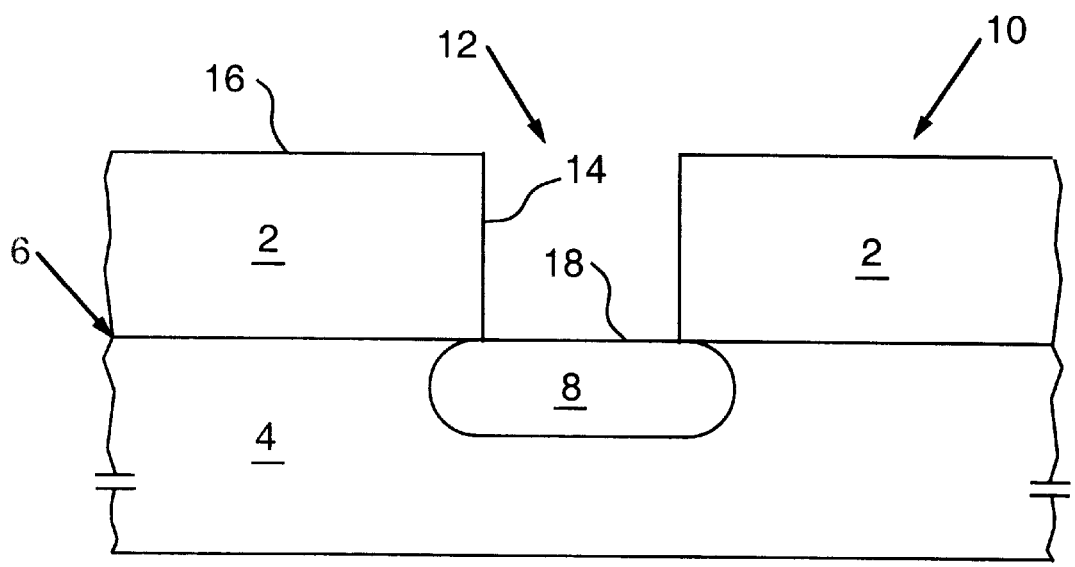

FIG. 2 is a cross-sectional view of the integrated circuit 10 after an opening 12 has been created in the dielectric layer 2. The opening 12 is defined by an inner wall 14 and extends from a top surface 16 of the dielectric layer 2 to the lower conductor 8. The formation of such an opening in a dielectric layer is well known in the prior art. For example, an anisotropic etch in a reactive ion etch ("RIE") reactor, using $CF_4+CHF_3$ at between 10° C. and 40° C. may be used. Many other methods of forming an opening are known, such as using a combination of isotropic and anisotropic etches to create sloped side walls in a dielectric layer.

Figure 3:
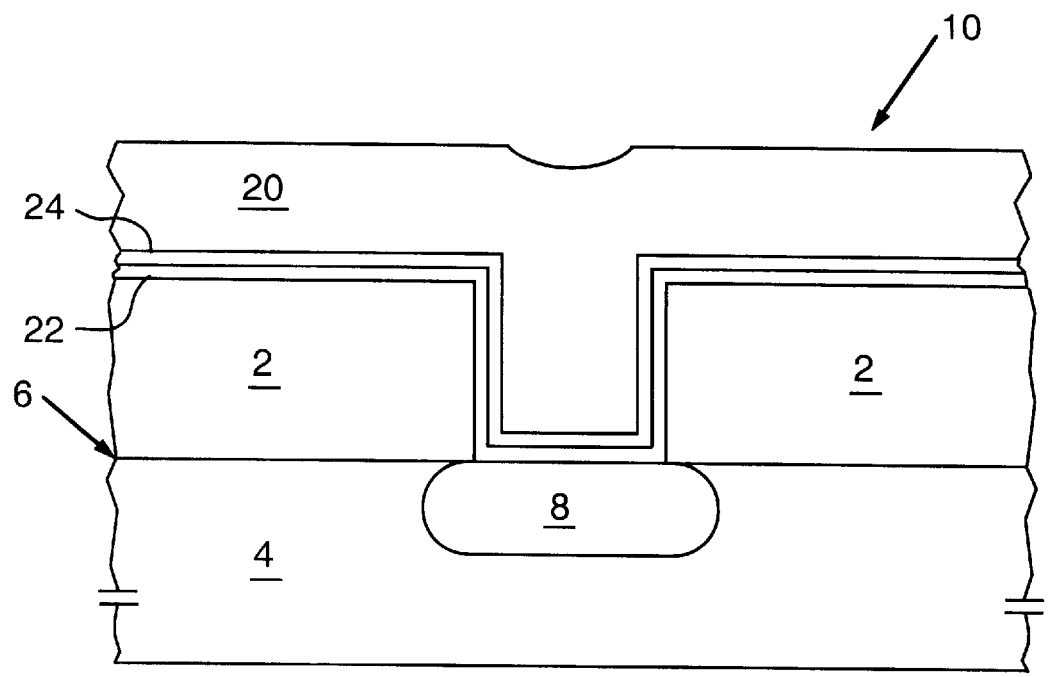

FIG. 3 is a cross-sectional view of the integrated circuit 10 after the deposition of a plug layer 20, which substantially fills the opening 12. Tungsten is preferred as the material for the plug layer 20 because it is easily deposited using a chemical vapor deposition ("CVD") process. Any conductor of current, however, may form the material for the plug layer 20. Because tungsten does not readily adhere to oxides, which comprise the dielectric layer 2 in the preferred embodiment, a "glue" layer 22 is preferably deposited before the plug layer 20. In the preferred embodiment titanium is used as the glue layer 22 because it adheres well to oxides and it consumes silicon dioxide, forming titanium silicide which has a low resistance. The silicon dioxide may remain at the bottom 18 of the opening 12 from previous process steps, and if it is not removed, it will increase the contact resistance between a plug, described below, and the lower conductor 8.

Titanium may be deposited, for example, by using a chemical vapor deposition ("CVD") process, preferably using a titanium-chloride chemistry, such as titanium and $CFCl_3$. Alternatively, titanium may be sputtered directly onto the opening 12. Because sputtered titanium often results in shadowing, a columniator may be utilized to provide a more uniform distribution.

An alternative glue layer is titanium silicide, deposited by a CVD process Titanium silicide CVD produces a conformal layer of titanium silicide, yielding uniform metal layers along the vertical and horizontal surfaces in and around the opening 12. The titanium silicide CVD process uses titanium tetrachloride in conjunction with titanium and silicon gasses to produce the layer of titanium silicide. Titanium silicide, however, does not consume silicon dioxide as titanium does.

In addition to the glue layer 22, a barrier layer 24 is used in the preferred embodiment because tungsten reacts with silicon to cause "worm holes" in the silicon. Worm holes result in small voids in the silicon surface where the silicon has migrated into the tungsten, and they increase the contact resistance and can cause leakage in diodes built in the silicon substrate. As a result, the barrier layer 24 is preferably used to separate the tungsten layer 20 from any form of silicon, such as a doped silicon substrate. When both a glue layer 22 and a barrier layer 24 are used, both the glue layer 22 and the barrier layer 24 may coat the bottom 18 and the walls 14 of the opening 12, as shown in FIG. 3.

Figure 4:
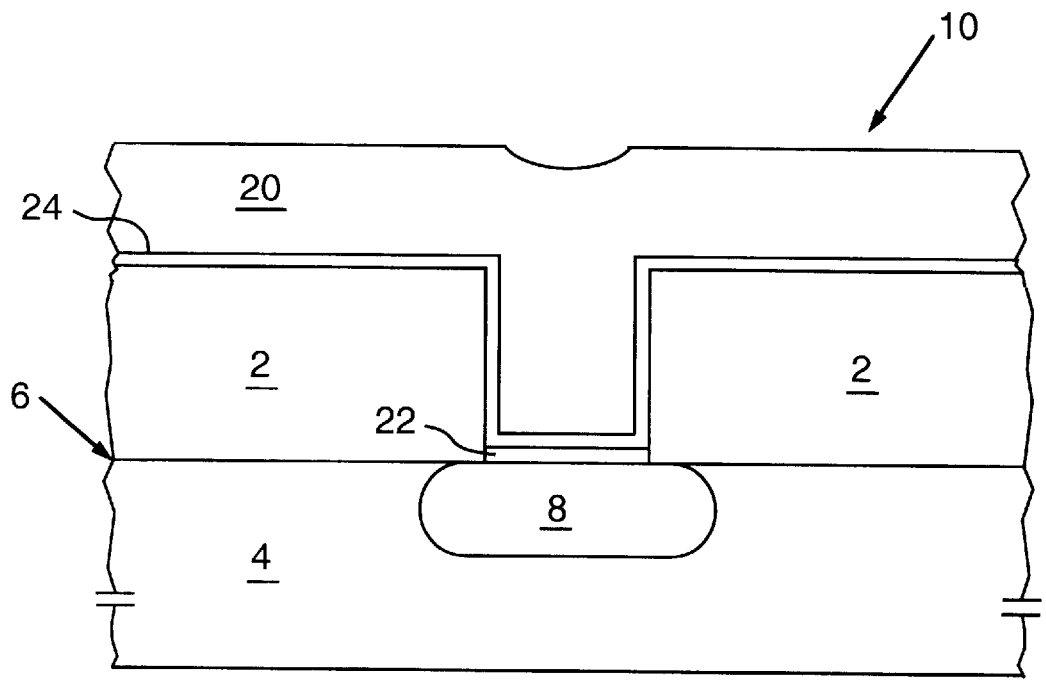
FIG. 4 illustrates an alternative embodiment.

FIG. 4 shows an alternative embodiment wherein the glue layer 22 is deposited only on the bottom 18 of the opening 12, so that it will consume any silicon dioxide present on the lower conductor 8. The barrier layer 24, however, is deposited on both the walls 14 and the bottom 18 of the opening 12. The preferred barrier layer 24, titanium nitride, is suitable as both a "barrier" and a "glue", and is deposited on top of the glue layer 22, to act as a barrier between tungsten and silicon, and on the walls 14 to act as a glue layer. Titanium nitride readily adheres to the titanium/titanium silicide glue layer 22, to the tungsten plug layer 20, and to the dielectric layer 2. It also forms an effective barrier between the tungsten plug 26 and silicon, and is conformal and easily deposited by a CVD process. The titanium nitride may also be deposited by annealing titanium in the presence of nitrogen or ammonia.

Regardless of the manner in which titanium nitride is deposited, an annealing step follows the deposition of the glue layer 22, preferably either immediately after the glue layer 22 is deposited, or after the barrier layer 24 is deposited. The annealing step is necessary for the titanium, which preferably comprises the glue layer 22, to effectively consume silicon dioxide.

The glue and barrier layers 22 and 24, of course, are preferably not-used when the plug 26 does not react adversely with any other materials in the opening 12, and when the plug 26 adequately adheres to the wall 14 and bottom 18 of the opening. In fact, the glue and barrier layers 22 and 24 are not required to utilize the invention, but they are used in the preferred embodiment. A layer of titanium may always be used, however, to consume silicon dioxide from the bottom 18 of the opening 12.

Figure 5:
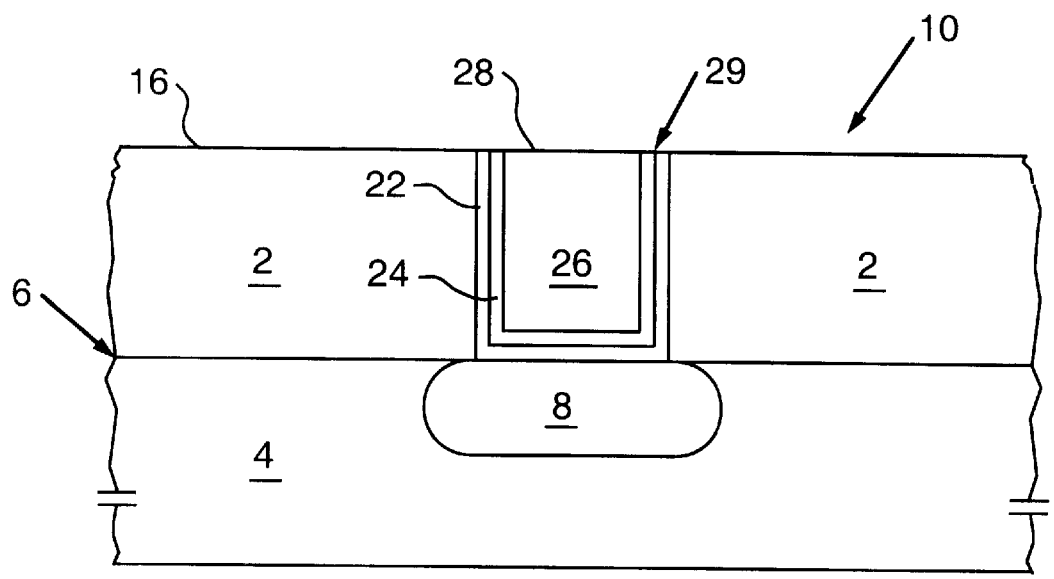

FIG. 5 shows a cross-sectional view of the integrated circuit 10 after portions of the plug layer 20, glue layer 22, and barrier layer 24 have been removed, leaving a plug 26 having a top surface 28 and an edge 29. The edge 29 of the plug 26 is defined generally by the glue and barrier layers 22 and 24. The portions of the-plug layer 20, glue layer 22, and barrier layer 24 may be removed, for example, by a dry etch process using a chlorine-based gas is used, such as chlorine gas, $CCl_4$, or HCl. Preferably, however, a chemicalmechanical polish ("CMP"), as described in U.S. Pat. No. 5,224,534 ("the '534 Patent") issued to Yu et al., assigned to Micron Technology, Inc. and incorporated herein by reference, may be used to remove the top layer of tungsten and leave the top surface 28 of the plug 26 even with the top surface 16 of the dielectric layer 2.

Figure 6:
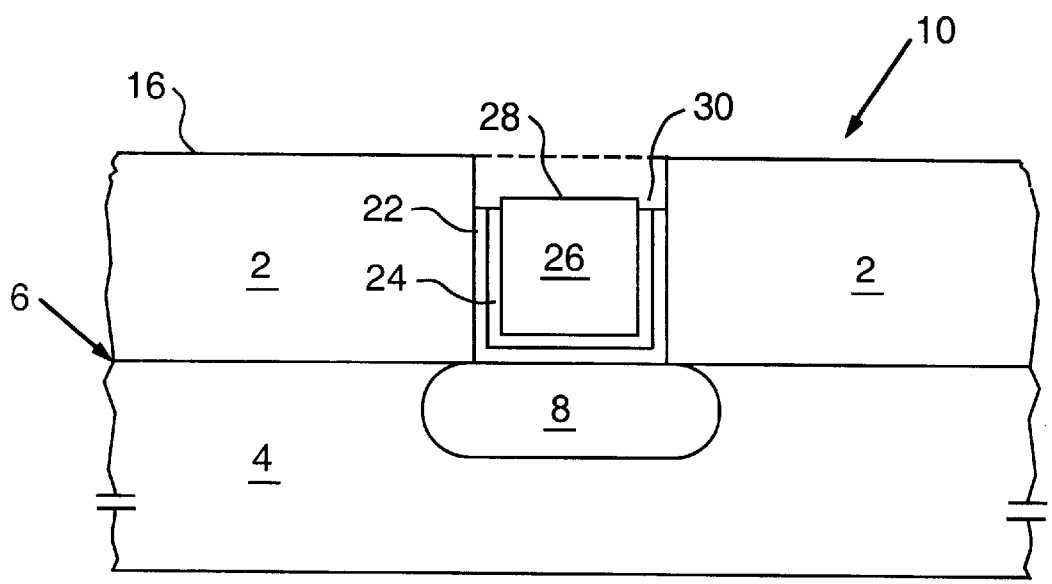

FIG. 6 shows the integrated circuit 10 after being subjected to a cleaning step. The surface of the integrated circuit 10 is cleaned, for example, by a bath of hydrofluoric acid which cleans the surface 16 of the dielectric layer 2 and opens up a small recess 30 in the glue and barrier layers 22 and 24 around the edge 29 of the plug 26. The recess 30 has a generally rectangular cross-section, is-typically between 1,000 and 2,000 Angstroms deep, typically about 1,000 Angstroms wide, and will often contain impurities. As discussed above, if the impurities remain in the recess 30 they may develop into a latent defect which may ultimately cause a failure of the device. As described in the '534 Patent, the CMP process may also form a recess 30 at the edge 29 of the plug 26, without the use of a hydrofluoric acid bath.

Following the cleaning step, an "etchback" step is preferably performed which removes material from the top surface 28 of the plug 26 so that the plug 26 is between about 1,000 to 2,000 Angstroms below the top surface 16 of the dielectric layer 2. The etchback is to compensate for the different etch rates of tungsten and BPSG oxide, in anticipation of an etch step described below with respect to FIG. 7. The depth of the etchback is chosen so that at the conclusion of the etch step, discussed below with respect to FIG. 7, the top surface 28 of the plug 26 and the top surface 16 of the dielectric layer 2 are even. The etchback may be achieved, for example, through a dry etch of the plug 26.

Figure 7:
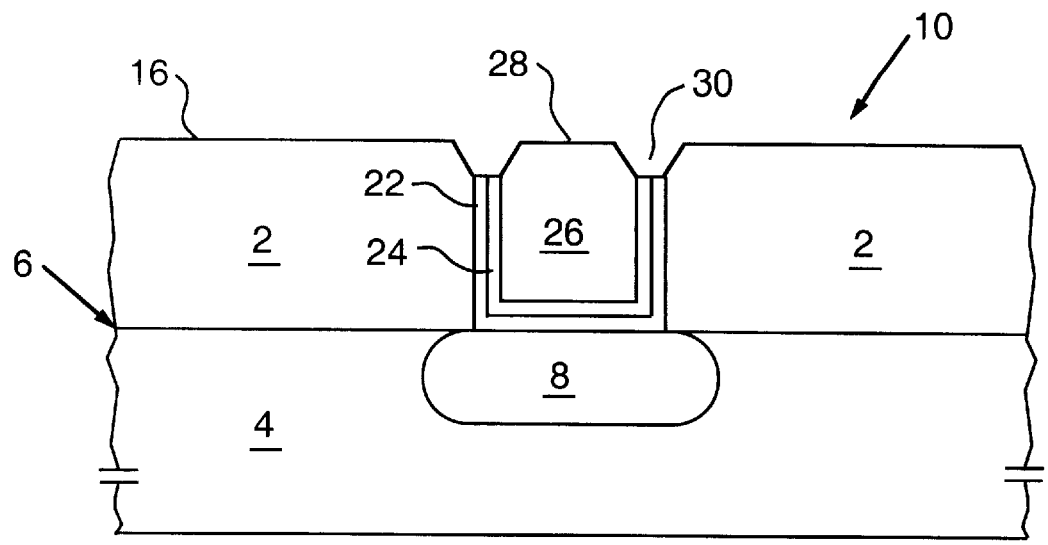

FIG. 7 shows a cross section of the integrated circuit 10 after it is subjected to an etch step to clean and enlarge the recess 30. After the recess 30 is enlarged it extends into the dielectric layer 2 and the plug 26. Many types of etches, such as facet etches and sputter etches, may be used to clean and enlarge the recess 30. It has been found, however, that superior results are achieved with a sputter etch using an argon plasma, with a pressure between five and fifty millitorr, a flow rate of between 10 and 100 standard cubic centimeters per minute ("sccm") of argon gas, a plasma energy level of between 1.7 and 5.1 watts per square centimeter of the target surface, and an angle between 40° and 60° above horizontal. In the most preferred embodiment, the sputter etch angle is 58° above horizontal. The sputter etch typically increases the width of the recess 30 from about 1,000 Angstroms to between about 2,000 Angstroms and 3,000 Angstroms, although the depth of the recess 30 is usually not significantly changed. Of course, both larger and smaller recesses 30 are possible, and the depth of the recess may be changed to suit particular needs by, for example, altering the sputter etch angle. When the sputter etch increases the width of the recess 30, it tapers the top surface 28 of the plug 26, which increases the surface area of the plug 26, and it tapers the top surface 16 of the dielectric layer 2. The increased surface area of the plug 26 allows for a lower resistance contact and better adhesion with a subsequently applied upper conductor. The tapered plug 26 and dielectric layer 2 also allow for very good step coverage over the recess 30 when a subsequent upper conductor layer is applied, as described below with respect to FIG. 8. The sputter etch also cleans the recess 30 of impurities and residue remaining from previous process steps, further reducing the likelihood of a latent defect. Furthermore, the sputter etch cleans the surface of the integrated circuit 10 of impurities and removes residue, such as tungsten particles deposited during the formation of the plug 26, which are often not removed in the cleaning step using hydrofluoric acid.

During the sputter etch step both the plug 26 and the dielectric layer 2 are etched, but because tungsten sputters more slowly than BPSG oxide, the thickness of the plug 26 decreases at a slower rate than the thickness of the dielectric layer 2. For that reason, in the preferred embodiment the top surface 28 of the plug 26 is etched back about 1,000 to 2,000 Angstroms below the top surface 16 of the dielectric layer 2 prior to the etch step. As a result of the etchback of the plug 26, at the conclusion of the sputter etch the top surface 28 of the plug 26 is approximately even with the top surface 16 of the dielectric layer 2.

Figure 8:
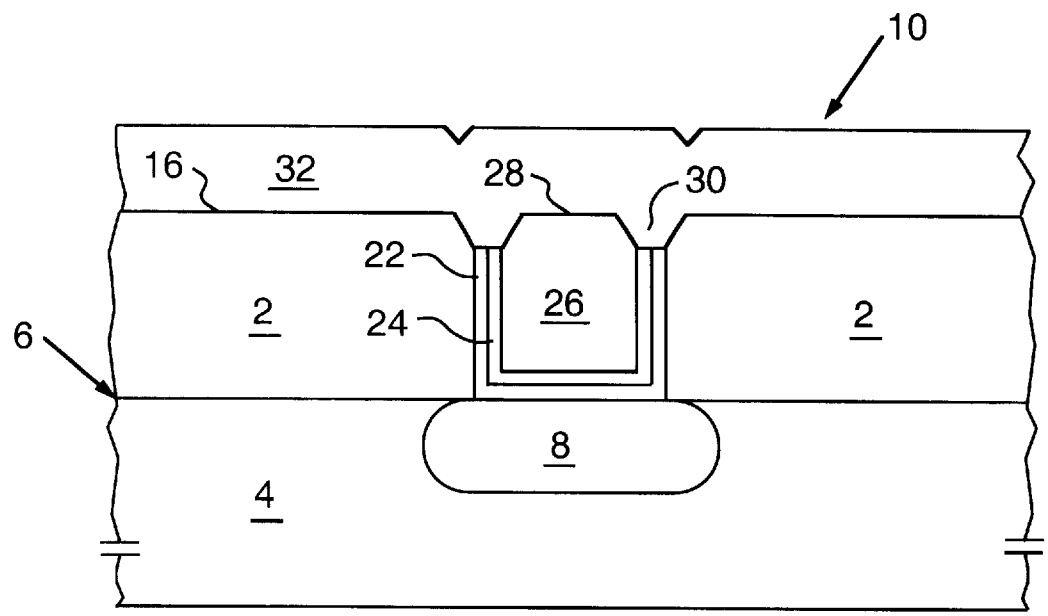

FIG. 8 is a cross-sectional view of the integrated circuit 10 after a top conductor layer 32 has been applied to the top surface 16 of the dielectric layer 2 and the top surface 28 of the plug 26. The top conductor layer 32 fills the recess 30, taking advantage of the increased surface area of the plug 26, and resulting in a lower resistance contact and better contact adhesion. Good step coverage over the recess 30 results from the tapered plug 26 and dielectric layer 2. The top conductor layer 32 may be any conductor of current, such as doped semiconductor aluminum, titanium, copper, or polysilicon, and methods of deposition of the top conductor layer 32 are well known in the prior art, such as by sputtering and CVD. The top conductor layer 32 is patterned to form conductive paths as is known in the art.

Figure 9:
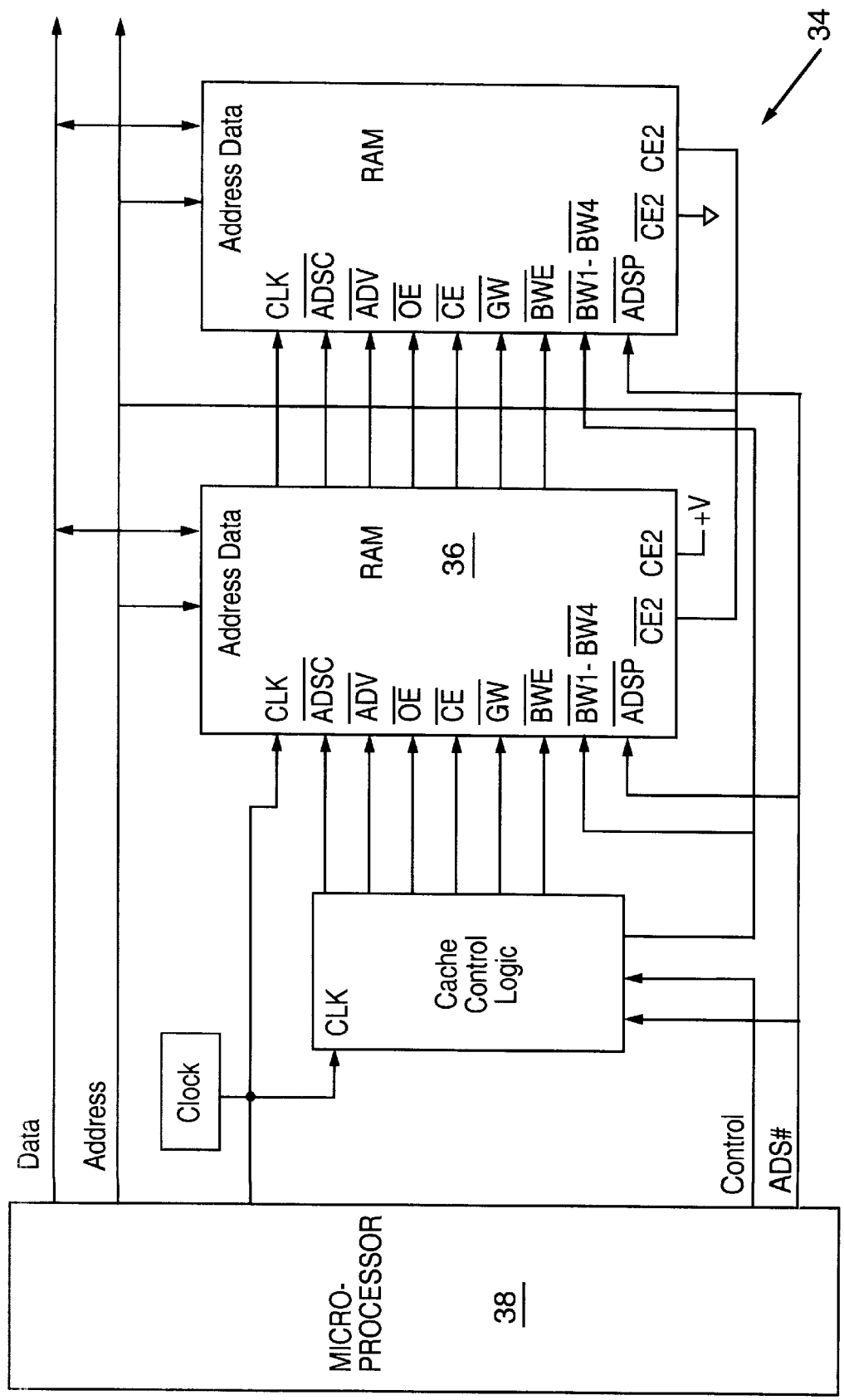
FIG. 9 illustrates a system in which the present invention may be employed.

FIG. 9 illustrates a system 34 in which the present invention may be employed. The system is comprised of a solid state device, such as memory device 36, in which connections of the type disclosed herein are made. The memory device is under the control of a microprocessor 38 which may be programmed to carry out particular functions as is known in the art.

Those with ordinary skill in the art will recognize that many modifications and variations of the present invention may be implemented. For example, the recess 30 may be formed in a plug 26 and dielectric layer 2 without the presence of glue and barrier layers 22 and 24. The foregoing description and the following claims are intended to cover all such modifications and variations.

What is claimed is:

1. A method of forming an interconnect between an upper conductor and a lower conductor, comprising:

depositing a dielectric layer on the lower conductor;

forming an opening extending through the dielectric layer, the opening defined by a sidewall of the dielectric layer;

depositing a glue layer in the opening;

depositing a barrier layer over the glue layer;

depositing a conductive plug over the barrier layer;

simultaneously tapering an upper surface of the dielectric layer and an upper surface of the conductive plug to the sidewall of the dielectric layer, wherein simultaneously tapering the upper surface of the dielectric layer and the upper surface of the conductive plug includes sputter etching a portion of the upper surface of the dielectric layer and a portion of the upper surface of the conductive plug at an angle; and forming the upper conductor on the upper surface of the dielectric layer and on the upper surface of the conductive plug.

2. The method of claim 1, wherein forming the opening includes etching the dielectric layer.

3. The method of claim 2, wherein etching the dielectric layer includes anisotropically etching the dielectric layer.

4. The method of claim 1, wherein depositing the conductive plug includes depositing the conductive plug by chemical vapor deposition.

5. The method of claim 1, wherein forming the upper conductor includes depositing the upper conductor by chemical vapor deposition.

6. The method of claim 1, wherein forming the upper conductor includes sputtering the upper conductor on the upper surface of the conductive plug and on the upper surface of the dielectric layer.

7. The method of claim 1, wherein depositing the glue layer in the opening includes depositing a glue layer on the lower conductor.

8. The method of claim 7, wherein depositing the glue layer in the opening includes depositing a glue layer on the sidewall of the dielectric layer.

9. The method of claim 1, wherein depositing the glue layer includes depositing the glue layer by chemical vapor deposition.

10. The method of claim 1, wherein depositing the glue layer includes sputtering the glue layer on the lower conductor.

11. The method of claim 1, wherein depositing the barrier layer includes depositing the barrier layer by chemical vapor deposition.

12. The method of claim 1, wherein depositing the barrier layer includes depositing the barrier layer by annealing.

* * * * *

UNITED STATES PATENT AND TRADEMARK OFFICE
CERTIFICATE OF CORRECTION

PATENT NO.    : 6,277,731 B1
DATED         : August 21, 2001
INVENTOR(S)   : Gonzalez et al.

It is certified that error appears in the above-identified patent and that said Letters Patent is hereby corrected as shown below:

Column 2,
Line 8, please replace the space between the words "opening" and "Additionally" with a period followed by two spaces.
Line 17, please replace the word "maybe" with the words -- may be. --
Line 45, please remove the period after the word "within."
Line 50, please replace the semicolon after the word "layer" with a period.

Column 4,
Line 7, please replace the space between the words "process" and "Titanium" with a period followed by two spaces.
Line 51, please replace the hyphen between the words "not" and "used" with a space.

Column 5,
Line 13, please replace the hyphen between the words "is" and "typically" with a space.

Signed and Sealed this

Eighteenth Day of November, 2003

JAMES E. ROGAN
*Director of the United States Patent and Trademark Office*